United States Patent [19]

Sugibayashi

[11] Patent Number: 5,581,205
[45] Date of Patent: Dec. 3, 1996

[54] SEMICONDUCTOR DEVICE CAPABLE OF ASSEMBLING ADJACENT SUB CHIPS INTO ONE CHIP

[75] Inventor: Tadahiko Sugibayashi, Tokyo, Japan

[73] Assignee: NEC Corporation, Tokyo, Japan

[21] Appl. No.: 358,304

[22] Filed: Dec. 19, 1994

[30] Foreign Application Priority Data

Dec. 30, 1993 [JP] Japan ................................. 5-352439

[51] Int. Cl.$^6$ .................................................. H03D 1/00
[52] U.S. Cl. .............................................. 327/50; 257/208
[58] Field of Search ............................. 327/18, 20, 564, 327/565, 50; 257/368, 208, 923; 365/200; 371/22.3

[56] References Cited

U.S. PATENT DOCUMENTS 5,093,879  3/1992  Bregman et al. ......................... 385/93
5,208,469  5/1993  Hodoshima ............................. 257/208
5,336,947  8/1994  Lehning ................................. 327/18
5,426,607  6/1995  Ishibashi ............................... 365/200

FOREIGN PATENT DOCUMENTS 0454447  10/1991  European Pat. Off. .
3214764  9/1991  Japan .
4-7867  1/1992  Japan .

Primary Examiner—Timothy P. Callahan
Assistant Examiner—Jung Ho Kim
Attorney, Agent, or Firm—Whitham, Curtis, Whitham & McGinn

[57] ABSTRACT

In a semiconductor device, a chip is constructed by a plurality of sub chips adjacent to each other on a wafer, each of the sub chips being able to carry out the same operation individually, and one neighbor detecting circuit is provided in each side of sub chips for detecting the presence or absence of an adjacent sub chip.

18 Claims, 15 Drawing Sheets

☒ ACCEPTABLE PRODUCT

☐ UNACCEPTABLE PRODUCT

☒ ACCEPTABLE PRODUCT

☐ UNACCEPTABLE PRODUCT

SEMICONDUCTOR DEVICE CAPABLE OF ASSEMBLING ADJACENT SUB CHIPS INTO ONE CHIP

BACKGROUND OF THE INVENTION

1. Field of the Invention

The present invention relates to a semiconductor device, and more particularly, to a semiconductor device which is constructed as one chip by a plurality of sub chips adjacent to each other on a wafer.

2. Description of the Related Art

The memory capacity of a memory device such as a dynamic random access memory (DRAM) has been increased while reducing the manufacturing yield. As a result, it has been suggested that a plurality of sub chips be combined to form one chip, to improve the manufacturing yield (see JP-A-HEI4-7867). This will be explained later in detail.

In the above-mentioned prior art semiconductor device, however, an alignment margin for assembling sub chips has to be provided in each of the sub chips, to reduce the integration. Also, in a large capacity semiconductor device such as a 256 Mbit DRAM device and a 1 Gbit DRAM device, a 4-sub-chip configuration, an 8-sub-chip configuration, . . . have to be used, and as a result, the number of function discrimination pads is increased, and also, the alignment margin for the assembly is also increased to reduce the integration.

SUMMARY OF THE INVENTION

It is an object of the present invention to provide a semiconductor device having a high integration where one chip can be constructed by an arbitrary number of sub chips.

According to the present invention, in a semiconductor device, a chip is constructed by a plurality of sub chips adjacent to each other on a wafer, each of the sub chips for carrying out the same operation individually, and one neighbor detecting circuit is provided at the side of each sub chip for detecting the presence or absence of an adjacent sub chip.

Thus, since adjacent sub chips are combined, no alignment margin is necessary. Also, in each of the sub chips, it is possible to confirm a position thereof in an assembled chip by the neighbor detecting circuit, so no function discriminating pad is necessary.

BRIEF DESCRIPTION OF THE DRAWINGS

The present invention will be more clearly understood from the description as set forth below, with reference to accompanying drawings, wherein.

DESCRIPTION OF THE PREFERRED EMBODIMENTS

Before the description of the preferred embodiments, prior art semiconductor devices will be explained with reference to FIGS. 1, 2 and 3.

Figure 1A:
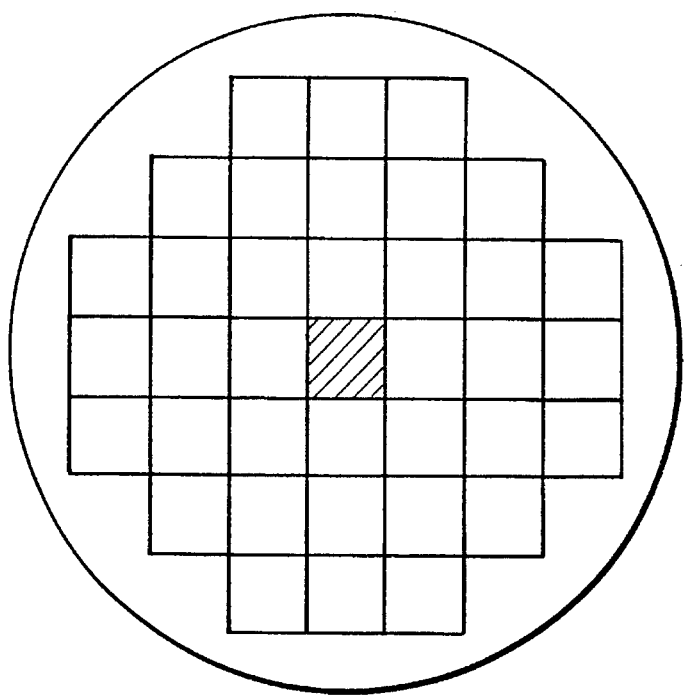
FIGS. 1A and 1B are diagrams showing acceptable and unacceptable products on a wafer.
Figure 1B:
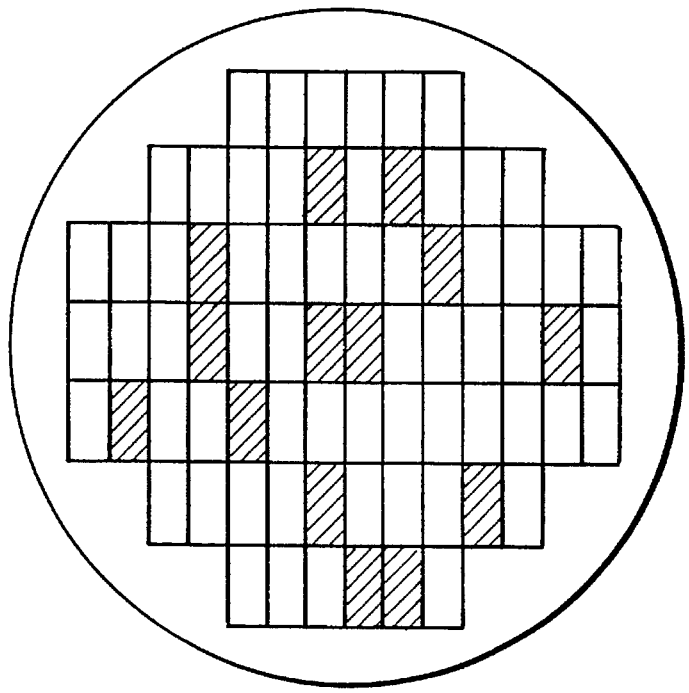

As explained above, the density of defects on a wafer is dependent upon a manufacturing process, and therefore, is almost definite. Therefore, if there is one acceptable chip as illustrated in FIG. 1A in the case where a 64 Mbit DRAM is constructed by one chip, there can be increased to 14 acceptable chips of 32 Mbit sub chips as illustrated in FIG. 1B. Therefore, if one chip is constructed by combining two 32 Mbit DRAM sub chips, seven acceptable 64 Mbit-DRAM's can be obtained., to enhance the manufacturing yield.

Figure 2:
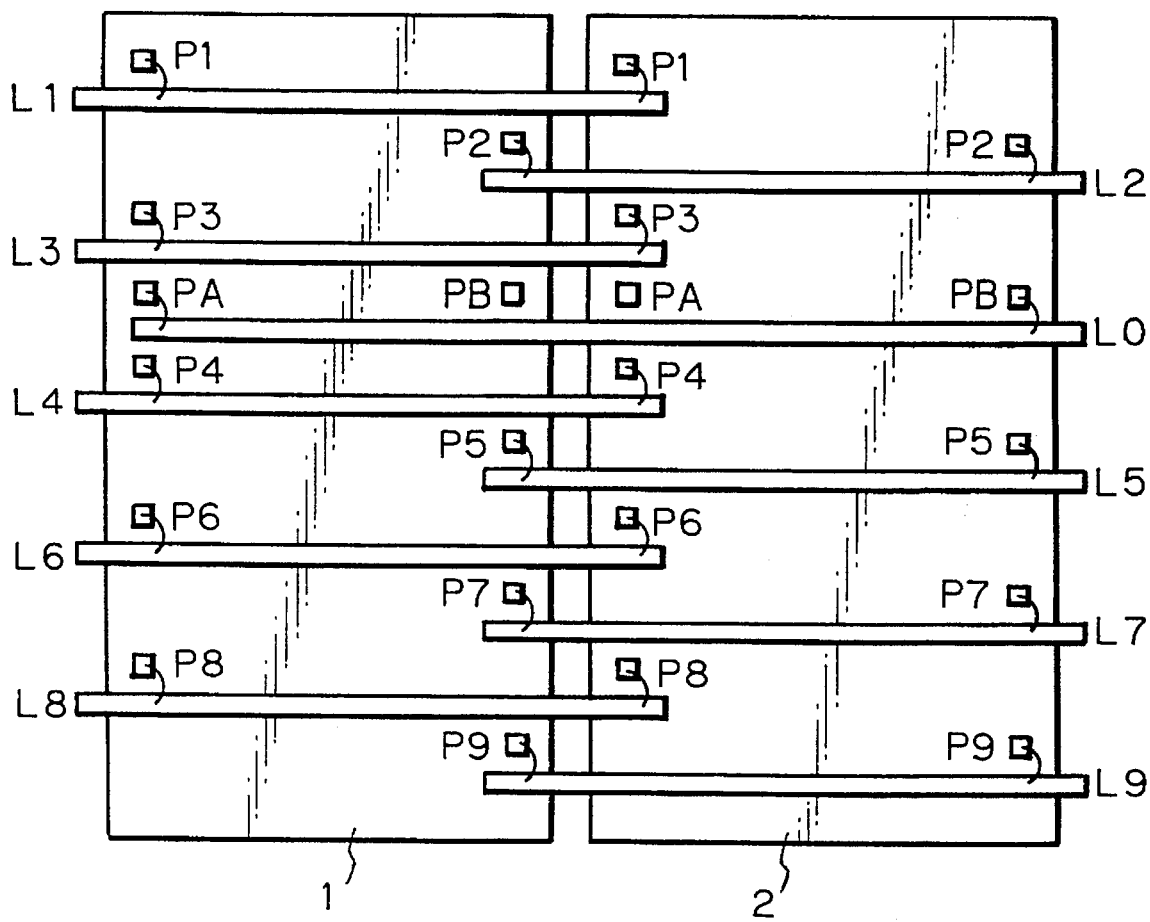
FIG. 2 is a plan view illustrating a prior art semiconductor device.

For example, as illustrated in FIG. 2, two sub chips 1 and 2 are combined to form one chip. In this case, pads P1, P2, . . . , and P9 having the same functions in the sub chips 1 and 2 are connected by bonding wires to lead frames L1, L2, . . . , and L9, respectively, while a lead frame L0 is connected by a bonding wire to function discrimination pad PA of the sub chip 1 and a function discrimination pad PB of the sub chip 2, thereby discriminating the functions of the chips 1 and 2 from each other (see JP-A-HEI4-7867).

In FIG. 2, as stated above, however, an alignment margin for assembling sub chips has to be provided in each of the sub chips, which reduces the integration. Also, in a large capacity semiconductor device such as a 256 Mbit DRAM device and a 1 Gbit DRAM device, a 4-sub-chip configuration, an 8-sub-chip configuration, . . . have to be used, and as a result, the number of function discrimination pads is increased, and also, the alignment margin for the assembly is also increased to reduce the integration.

Figure 3:
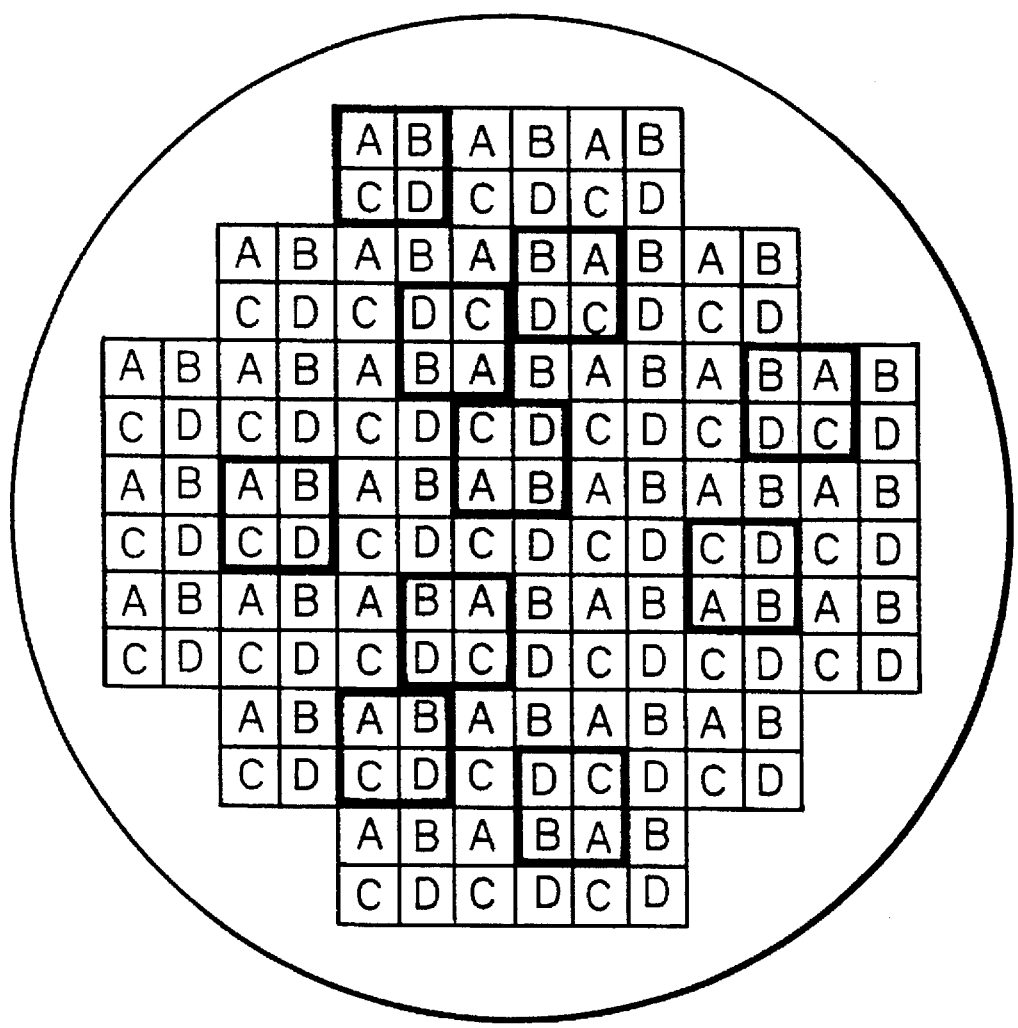
FIG. 3 is a plan view illustrating another prior art semiconductor device.

Note that, as illustrated in FIG. 3, in a semiconductor device when four adjacent sub chips having different functions A, B, C and D are derived to form one chip, the selection of sub chips is arbitrary to improve the manufacturing yield (see JP-A-HEI3-214764). In this case, however, since the sub chips have different functions, there is a limit in the enhancement of the manufacturing yield.

Figure 4:
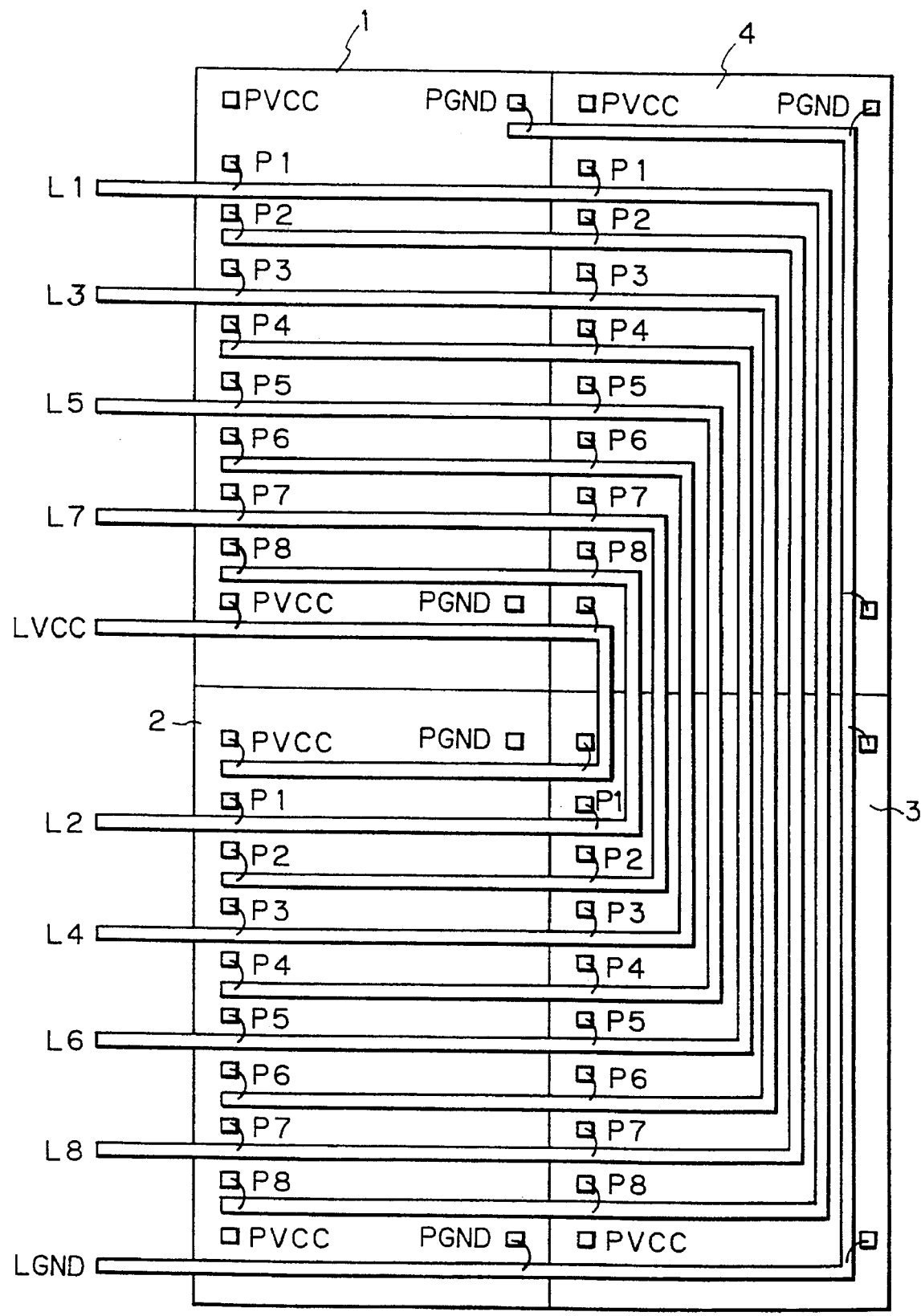
FIG. 4 is a plan view illustrating a first embodiment of the semiconductor device according to the present invention.

In FIG. 4, which illustrates a first embodiment of the present invention, four adjacent sub chips on a wafer are combined to form one chip. In this case, each sub chip 1, 2, 3 and 4 has a 256 Mbit DRAM function, and these chips are combined with each other to form one 1 Gbit DRAM.

Figure 5:
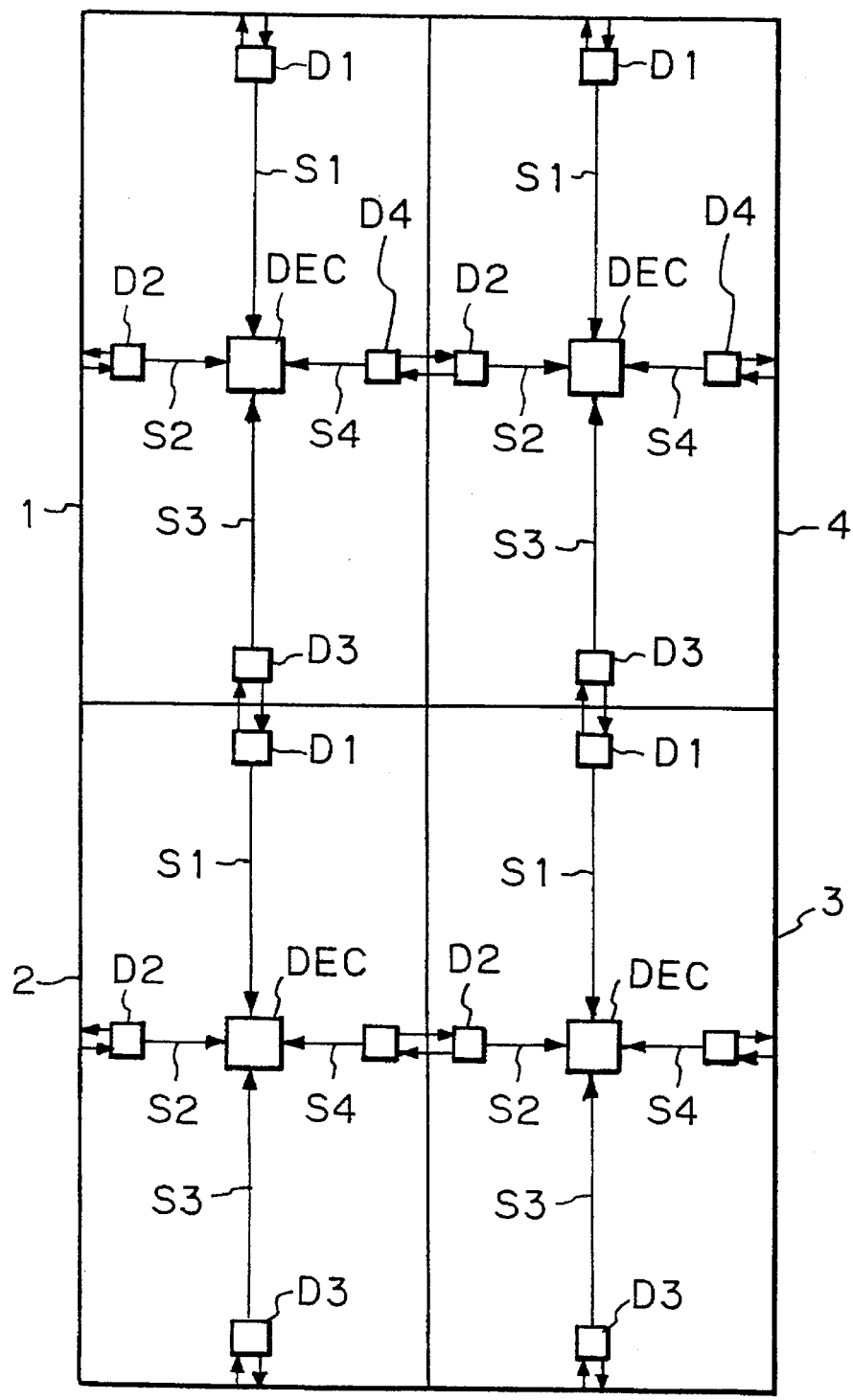
FIG. 5 is a plan view illustrating an arrangement of the neighbor detecting circuits and the decoders of FIG. 4.

Provided in each of the sub chips 1, 2, 3 and 4 are power supply pads PVCC, ground pads PGND, and pads P1, P2, . . . , and PS. The sub chips 1, 2, 3 and 4 are combined by a lead on chip system. In this case, lead frames LVCC, LGND, L1, L2, . . . , and L8 are U-shaped. Therefore, when bonding wires, one of the power supply pad PVCC and the ground pad PGND is connected to one of the lead frames LVCC and LGND, and the other of the power supply pad PVCC and the ground pad PGND is connected to the other of the lead frames LVCC and LGND. Also, the connections between the lead frames L1, L2, . . . , and L8 and the pads P1, P2, . . . , and P8 are in a forward sequence in the sub chips 1 and 4, and in a reverse sequence in the sub chips 2 and 3. That is, the forward sequence of the lead frames L1, L8, L3, L6, L5, L4, L7 and L2 correspond to the pads P1 through P8, respectively, in sub chips 1 and 4, and the reverse sequence of the lead frames L2, L7, L4, L5, L6, L3, L8 and L1 correspond to the pads P1 through P8, respectively. Further, neighbor detecting circuits are provided on four sides of each of the sub chips 1, 2, 3 and 4, although they are shown not in FIG. 4, but are shown in FIG. 5. Also, provided in each of the sub chips 1, 2, 3 and 4 is a decoder DEC for recognizing its position in accordance with the outputs of these neighbor detecting circuits (see FIGS. 5 and 6). Further, an input/output switching circuit for switching an input or output in accordance with the output of the decoder or the output of the neighbor detection circuit (see FIG. 7). Thus, the forward sequence or reverse sequence regarding the connections between the lead frames L1, L2, . . . , and L8 and the pads P1, P2, . . . , and P8 can be recognized within the sub chips 2, 3 and 4.

As illustrated in FIG. 5, in each of the sub chips 1, 2, 3 and 4, a neighbor detecting circuit D1 is provided on an upper side, a neighbor detecting circuit D2 is provided on a left side, a neighbor detecting circuit D3 is provided on a lower side, and a neighbor detecting circuit D4 is provided on a right side. Detection signals S1, S2, S3 and S4 of the neighbor detecting circuits D1, D2, D3 and D4 are input to the decoder DEC. If the neighbor detecting circuits D1, D2, D3 and D4 are normal, the output signals S1, S2, S3 and S4 in response to the presence or absence of their neighbor sub chips are made high levels (H) and low levels (L) as follows:

| SUB CHIP | S1 | S2 | S3 | S4 |
| --- | --- | --- | --- | --- |
| 1 | L | L | H | H |
| 2 | H | L | L | H |
| 3 | H | H | L | L |
| 4 | L | H | H | L |
| SINGLE CHIP | L | L | L | L |

Figure 6:
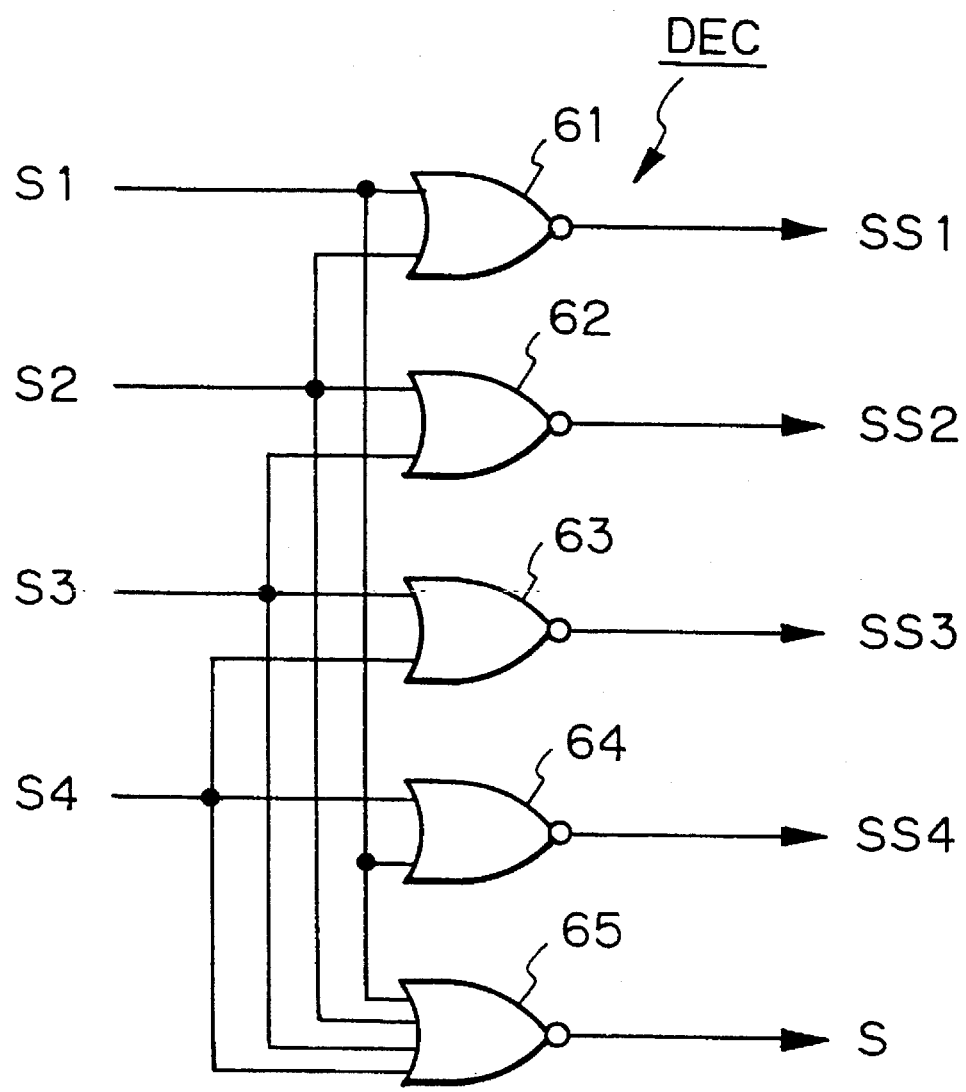
FIG. 6 is a circuit diagram of the decoder of FIG. 5.

Therefore, as illustrated in FIG. 6, the decoder DEC of FIG. 5 is constructed by five NOR circuits 61, 62, 63, 64 and 65, to recognize the position of each sub chip. Note that, in FIG. 6, the following are indicated:

SS1: left-upper side position (the sub chip 1 of FIG. 4);

SS2: left-lower side position (the sub chip 3 of FIG. 4);

SS3: right-lower side position (the sub chip 3 of FIG. 4); and

SS4: right-upper side position (the sub chip 4 of FIG. 4).

Also, S shows a non-connection state. Further, signals SS1 to SS4 and S of the decoder DEC are used within the sub chip for discriminating functions.

Figure 7A:
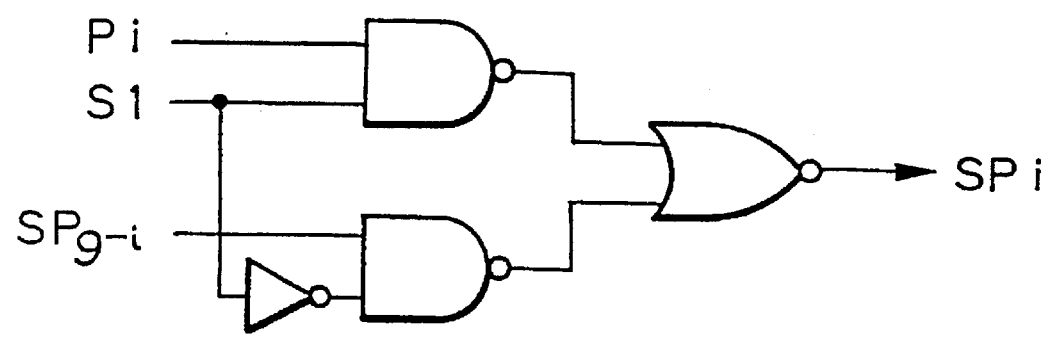
FIG. 7A is a circuit diagram of the input switching circuit of FIG. 4.
Figure 7B:
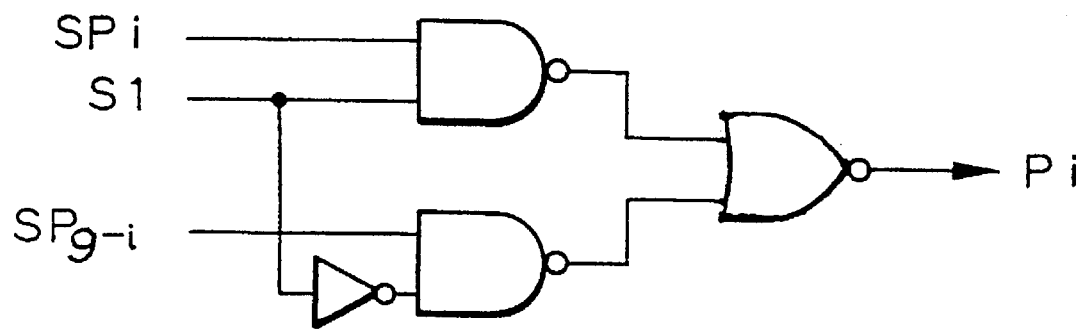
FIG. 7B is a circuit diagram of the output switching circuit of FIG. 4.

As explained above, the forward sequence or reverse sequence of the connections between the lead frames L1, L2, . . . , and L8 and the pads P1, P2, . . . , and P8 is dependent upon whether the sub chip is located on the upper side or on the lower side. On the other hand, whether the sub chip is located on the upper side or the lower side can be recognized by the outputs SS1 to SS4 of the decoder DEC or by the output signal S1 or S3 of the neighbor detecting circuit D1 or D3. For example, in the case of the output signal S1 of the neighbor detecting circuit D1, if the signal S1 is at a low level, the corresponding sub chip is located on the upper side, while if the signal S1 is at a high level, the corresponding sub ship is located on the lower side. Therefore, the input switching circuit can be constructed as illustrated in FIG. 7A, and the output switching circuit can be constructed as illustrated in FIG. 7B. In FIGS. 7A and 7B, $P_i$ and $P_{s-i}$ show signals at the pads $P_i$ and $P_{9-i}$, respectively, and $SP_i$ and $SP_{s-i}$ show an i-th internal signal and an (9-i)-th internal signal, respectively. In FIG. 7A, if i=1, $SP_i=P_1$ or $P_8$ in accordance with the signal S1. That is, if S1="1", $(SP_1, SP_2, \ldots, SP_8)=(P_1, P_2, \ldots, P_8)$, and if S1="0", $(SP_1, SP_2, \ldots, SP_8)=(P_8, P_7, \ldots, P_1)$.

Also, in FIG. 7B, if i=1, $P_1=SP_1$ or $SP_8$ in accordance with the signal S1. That is, if S1="1", $(P_1, P_2, \ldots, P_8) = (SP_1, SP_2, \ldots, SP_8)$, and if S1="0", $(P_1, P_2, \ldots, P_8) = (SP_8, SP_7, \ldots, SP_1)$. The sequence $(P_1, P_2, \ldots, P_8)$ and the sequence $(SP_1, SP_2, \ldots, SP_8)$ can be reversed as occasion demands.

Figure 8:
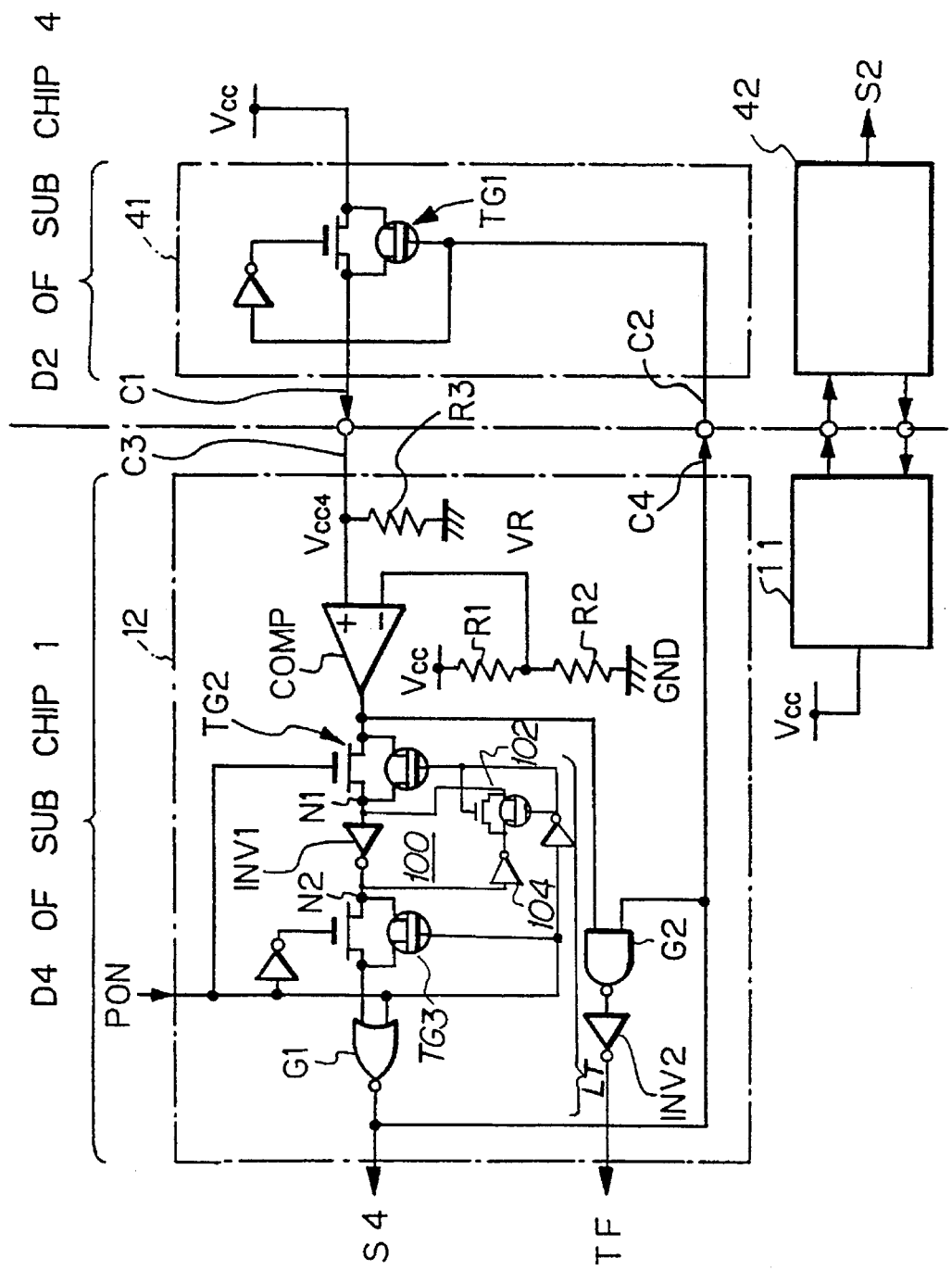
FIG. 8 is a circuit diagram of the neighbor detecting circuit of FIG. 5.

Next, the details of the neighbor detecting circuit of FIG. 2 are explained with reference to FIG. 8. In FIG. 8, which illustrates the neighbor detecting circuit D4 of the sub chip 1 and the neighbor detecting circuit 4 of the sub chip 4, each of the neighbor detecting circuits D2 and D4 includes a circuit portion 41 (11) for transmitting a power supply voltage $V_{cc}$ to an adjacent sub chip and a circuit portion 42 (12) for processing a signal transmitted from an adjacent sub chip to generate a detection signal S2 (S4). However, only the circuit portion 42 of the sub chip 4 and the circuit portion 12 of the sub chip 1 are illustrated in detail, while the details of the circuit portion 11 of the sub chip 1 and the circuit portion 42 of the sub chip 4 are the same as the circuit portion 41 of the sub chip 4 and the circuit portion 12 of the sub chip 1, and are therefore omitted.

The circuit portion 41 has two connection lines C1 and C2, and the circuit portion 12 has two connection lines C3 and C4 corresponding to the connection lines C1 and C2, respectively. When the sub chip 1 is directly adjacent to the sub chip 4 as illustrated in FIG. 8, the connection lines C3 and C4 of the sub chip 1 are in contact with the connection lines C1 and C2, respectively, of the sub chip 4, so that the connection lines C3 and C4 are electrically connected to the connection lines C1 and C2, respectively.

The circuit portion 41 includes a transfer gate TG1 connected between a power supply line $V_{cc}$ (which also represent the voltage thereof) and the connection line C1. The transfer gate TG1 is controlled by the voltage at the connection line C2. That is, when the voltage at the connection line C2 is low, the transfer gate TG1 is turned ON (opened) to pass the power supply voltage $V_{cc}$. Contrary to this, when the voltage at the connection line C2 is high, the transfer gate TG1 is turned OFF (closed).

The circuit portion 12 includes a comparator COMP for comparing a voltage $V_{cc4}$ from the sub chip 4 with a reference voltage VR from a voltage divider formed by resistors R1 and R2, and a latch circuit LT for latching the output signal of the comparator COMP controlled by an power-on detection signal PON. In more detail, the latch circuit LT is constructed by a transfer gate TG2 turned ON by a high level of the power-on detection signal PON, an inverter INV1, a transfer gate TG3 turned ON by a low level of the power-on detection signal PON, and a NOR circuit G1 for carrying out a NOR logic between the output signal of transfer gate TG3 and the power-on detection signal PON. A feedback path 100 may also be provided between INV1 and TG2. The feedback path 100 comprises a CMOS switch 102 which feeds back, through inverter 104, the output of INV1 to node N1. Further, the circuit portion 12 has a NAND circuit G2 and an inverter INV2 for detecting a failure of the circuit portion 12, particularly, the comparator COMP. Note that an input resistor R3 of the comparator COMP has a relatively large resistance value.

Figure 9A:
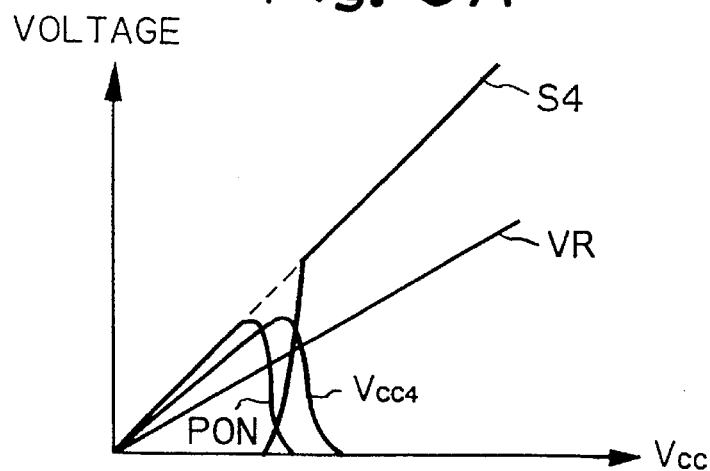
FIGS. 9A, 9B and 9C are voltage waveform diagrams showing the operation of the circuit of FIG. 8.

In the case where the neighbor detecting circuit D4 of the sub chip 1 is normally connected to the neighbor detecting circuit D2 of the sub chip 4, the operation of the circuit of FIG. 8 is explained next with reference to FIG. 9A. When the power supply voltage $V_{cc}$ on the side of the sub chip 1 rises, the power-on detection signal PON rises as shown. In an initial stage, the detection signal S4 is at a low level (0 V). Therefore, since the transfer gate TG1 is turned ON, the comparison voltage $V_{cc4}$ of the sub chip 1 follows the voltage $V_{cc}$ of the sub chip 4. As a result, $V_{cc4}$>VR, so that the output of the comparator COMP becomes a high level. Therefore, a high level and a low level are latched at nodes N1 and N2, respectively, of the latch circuit LT. At this time, when the power-on detection signal PON is changed from a high level to a low level, the output signal S4 of the NOR circuit G1 is changed from a low level to a high level due to the NOR logic with the low level at the node N2 of the latch circuit LT, and hereinafter, this state is continued by the latch circuit LT. Note that, in this state, the transfer gate TG1 is turned OFF by the signal S4. Therefore, since the output of the comparator COMP becomes a low level, a fault detection signal TF is at a low level. Thus, a normal connection state is detected by the high level of the detection signal S4.

Figure 9B:
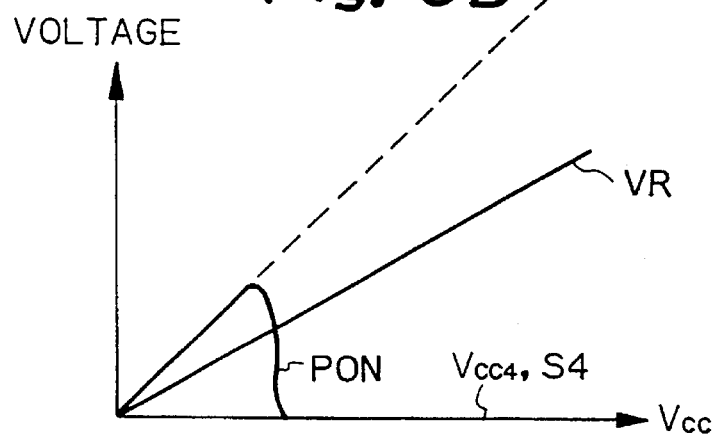

In the case where the neighbor detecting circuit D4 of the sub chip 1 is not normally connected to the neighbor detection circuit D2 or the power supply voltage $V_{cc}$ of the sub chip 4 is not given, the operation of the circuit of FIG. 8 is explained next with reference to FIG. 9B. Also, in this case, when the power supply voltage $V_{cc}$ on the side of the sub chip 1 rises, the power-on detection signal PON rises as shown. Also, in an initial stage, the detection signal S4 is at a low level (0 V). However, the comparison voltage $V_{cc4}$ of the sub chip 1 is at a low level. As a result, $V_{cc4}$<VR, so that the output of the comparator COMP becomes a low level. Therefore, a low level and a high level are latched at the nodes N1 and N2, respectively, of the latch circuit LT. At this time, when the power-on detection signal PON is changed from a high level to a low level, the output signal S4 of the NOR circuit G1 remains at a low level due to the NOR logic with the low level at the node N2 of the latch circuit LT. Hereinafter, this state is continued by the latch circuit LT. Note that, in this state, since the output of the comparator COMP is at a low level, a fault detection signal TF is at a low level. Thus, a disconnection state is detected by the low level of the detection signal S4.

Figure 9C:
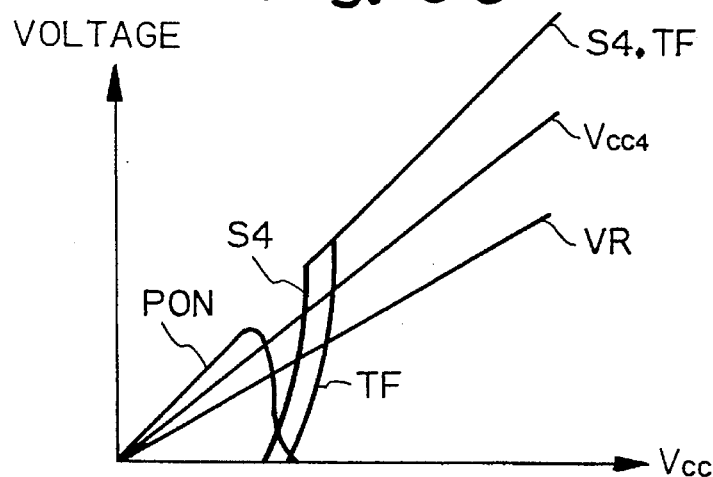

In the case where the resistor R3 of the neighbor detection circuit D4 of the sub chip 1 is open and failed, the operation of the circuit of FIG. 8 is explained next with reference to FIG. 9C. In the same way as in FIG. 9A, the power-on detection signal PON rises, and thereafter, the power-on detection signal PON is changed from a high level to a low level. Hereinafter, the signal S4 continues to rise due to the latch circuit LT. However, even after the transfer gate TG1 is turned OFF by the signal S4, the input $V_{cc4}$ of the comparator COMP is increased due to the opening state of the resistor R3. Therefore, even after the transfer gate TG1 is turned OFF by the signal S4, the output of the comparator COMP holds a high level. Thus, a fault state is detected by the high level of the fault detection signal TF. Note that, the fault detection signal TF is read by a test circuit (not shown), and as a result, the sub chip in which the fault detection signal TF is at a high level is rejected as a defective product.

Figure 10:
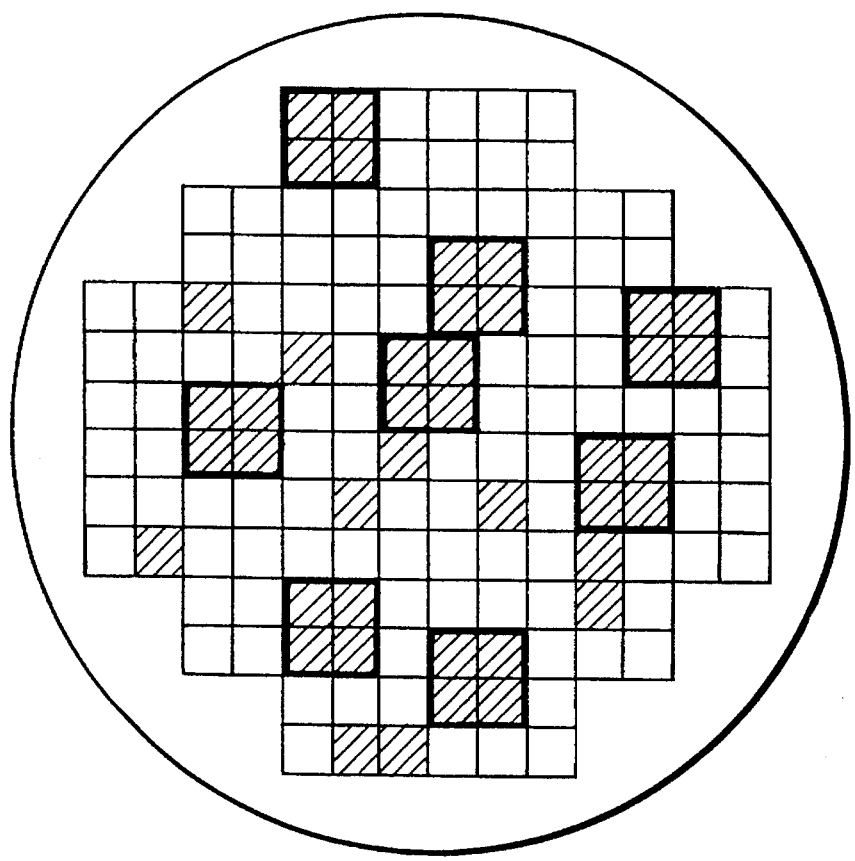
FIG. 10 is a diagram showing acceptable and unacceptable products by the first embodiment of the present invention.

FIG. 10 is a wafer showing acceptable products and unacceptable products made by the first embodiment of the present invention. That is, when four adjacent sub chips are acceptable, the four sub chips are deemed as a 1 Gbit DRAM device, while when a sub chip is acceptable individually, the sub chip is deemed as a 256 Mbit DRAM device.

Figure 11:
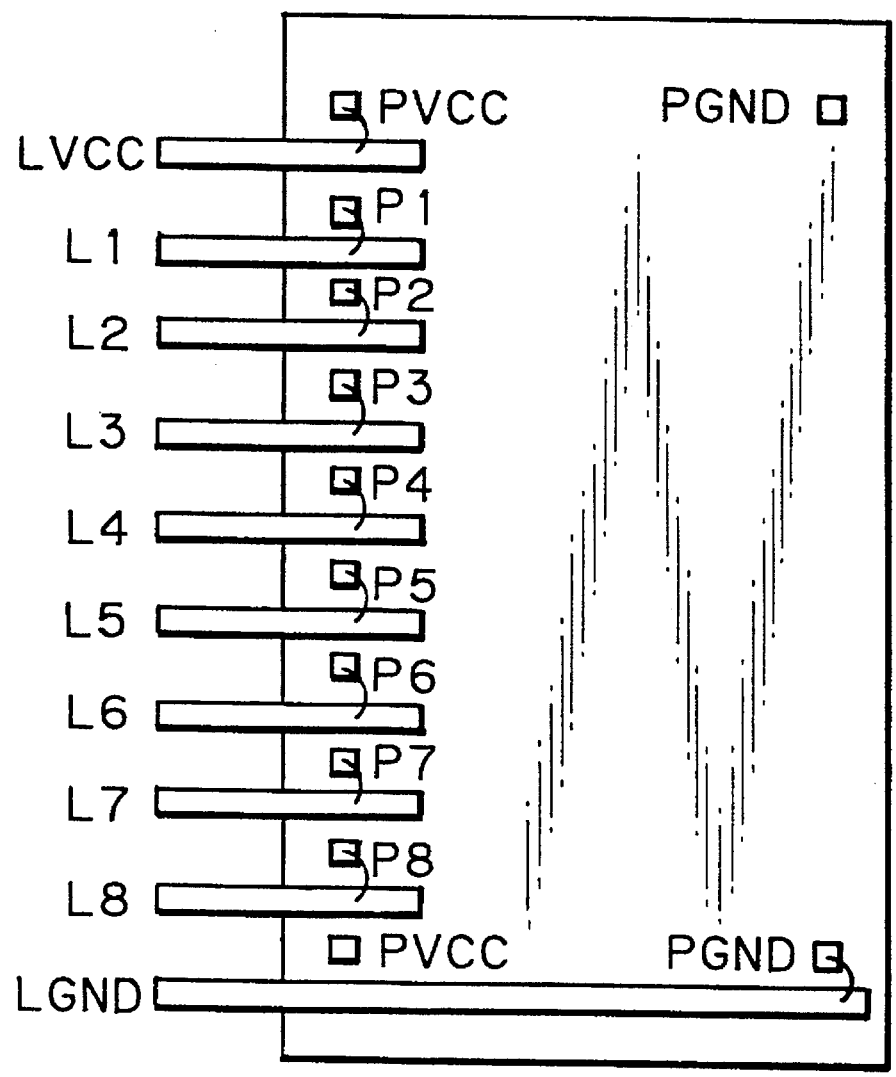
FIG. 11 is a diagram showing connections of a sub chip which is individually acceptable.
Figure 12:
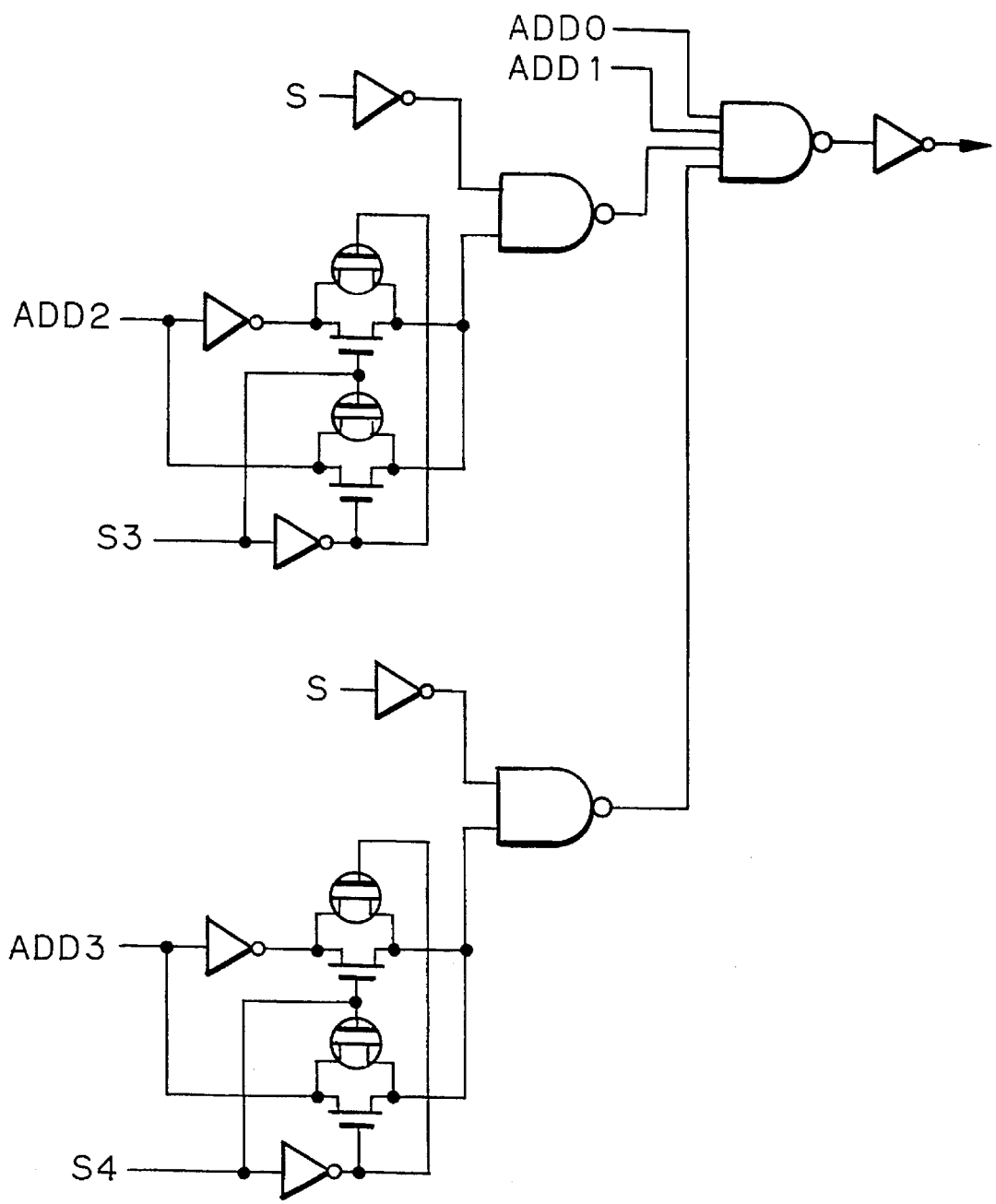
FIG. 12 is a circuit diagram illustrating an example of the address decoder in the first embodiment of the present invention.

As explained above, when a sub chip is individually acceptable, lead frames are mounted as illustrated in FIG. 11. Note that, in this case, since this sub chip is used as a 256 Mbit DRAM device, the bits of an address are reduced by two. For example, as illustrated in FIG. 12, paths of two address signals ADD2 and ADD3 are killed by the nonconnection state signal S of FIG. 3. Note that, the detection signals S3 and S4 is suuplied to use the four sub chips as a 1 Gbit DRAM device, and simultaneously, the address signals ADD2 and ADD3 are reversed for a sub chip located on the left-lower side of the four sub chips and the address signals ADD2 and ADD3 are used as they are for a sub chip located on left-upper side of the four sub chips.

Figure 13:
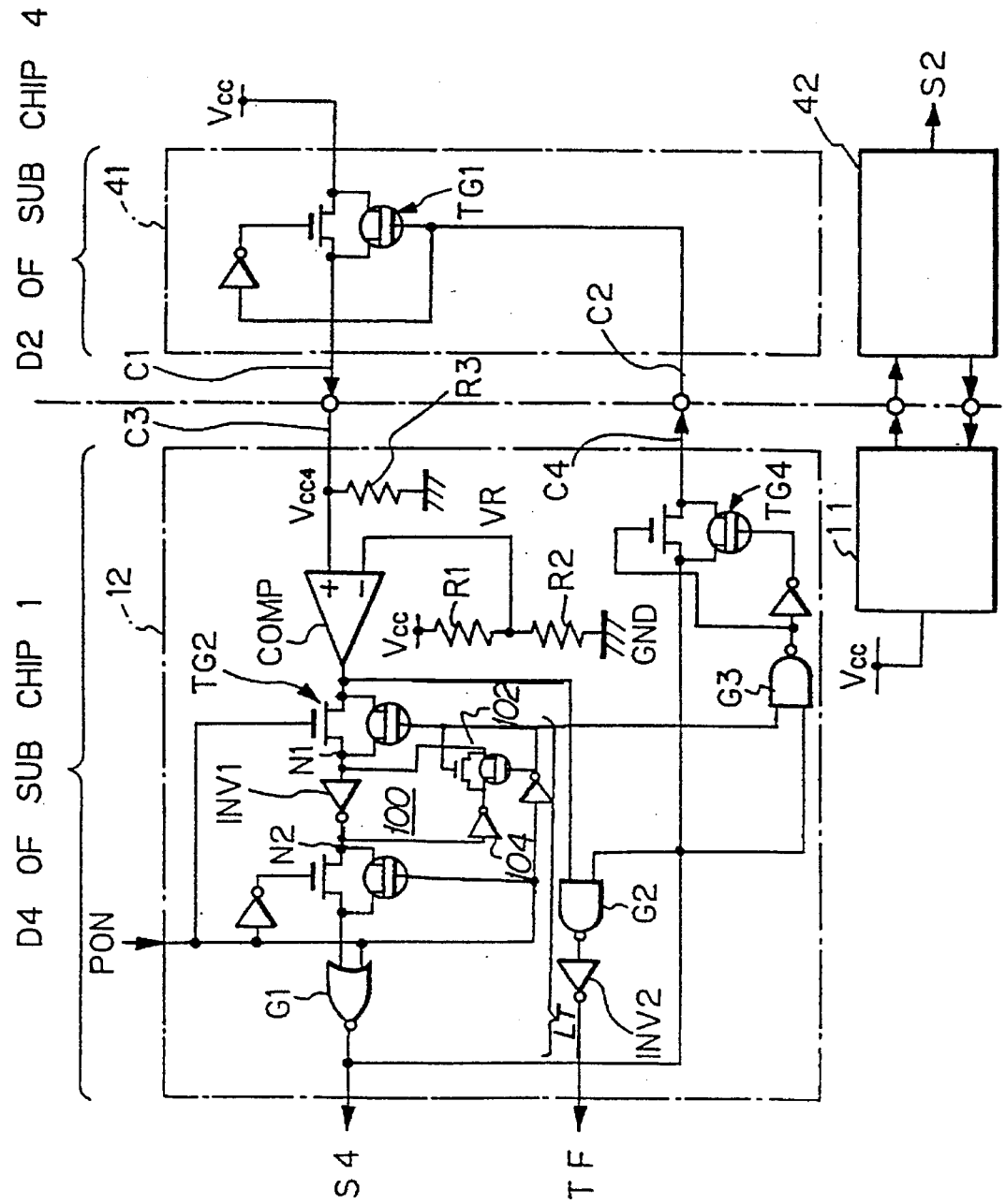
FIG. 13 is a circuit diagram illustrating a modification of FIG. 8.

FIG. 13 illustrates a modification of FIG. 8. That is, in FIG. 8, the detection signal S4 of the neighbor detecting circuit D4 of the sub chip 1 is directly input to the sub chip 4. However, when the sub chip is used as an individual chip, i.e., a 256 Mbit DRAM device, the signal S4 is in contact with a cut face of the wafer, which invites a failure. Therefore, in FIG. 13, a NAND circuit G3 and a transfer gate TG4 are added to the elements of FIG. 8. Thus, when the power-on detection signal PON is changed from a high level to a low level and the detection signal S4 is changed from a low level to a high level, the transfer gate TG4 is turned OFF so that the signal S4 is separated from the cut face of the wafer, i.e., the signal S4 is in a high impedance state.

Figure 14:
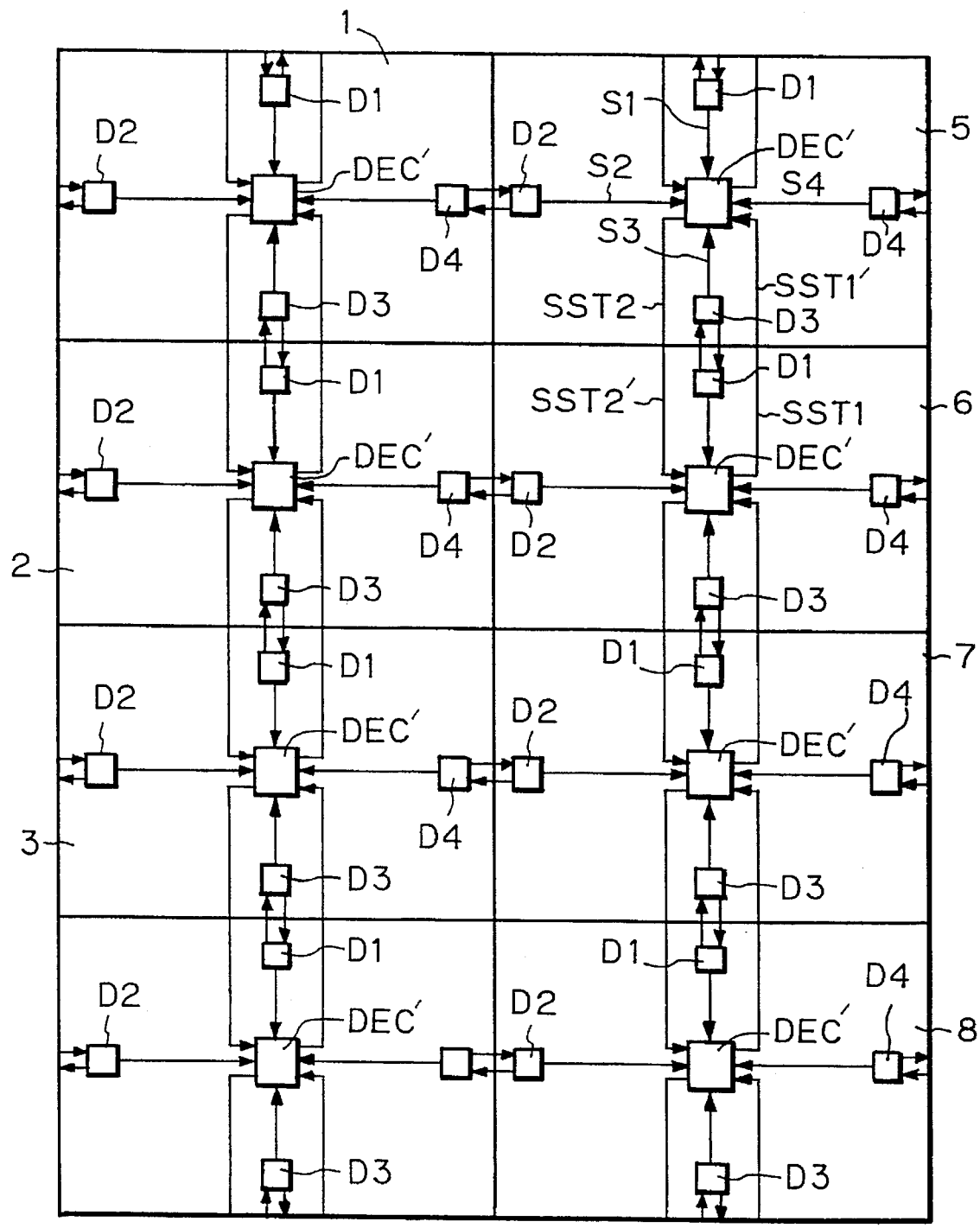
FIG. 14 is a plan view illustrating a second embodiment of the semiconductor device according to the present invention.
Figure 15:
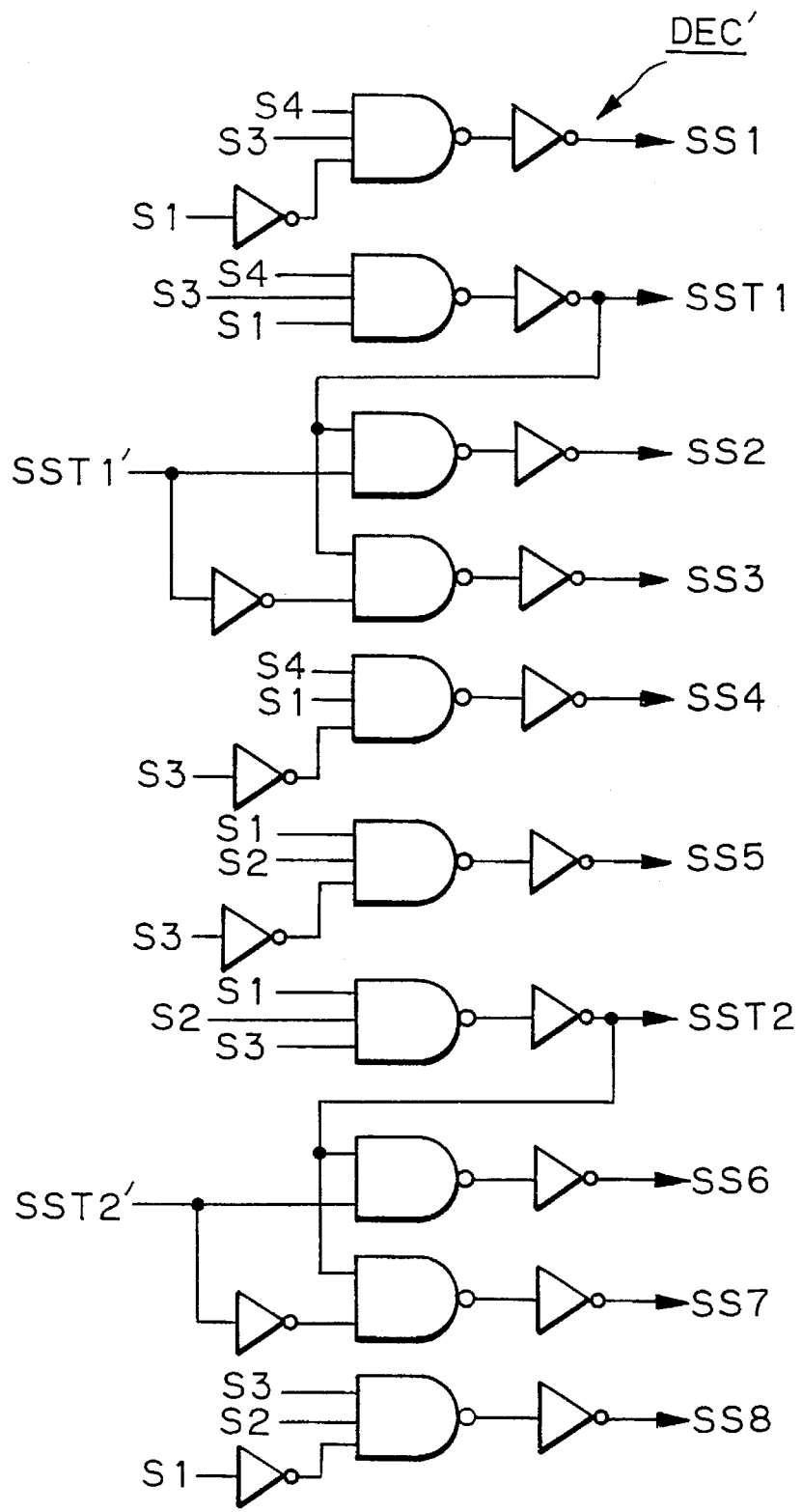
FIG. 15 is a circuit diagram of the decoder of FIG. 14.

In FIG. 14, which is a plan view illustrating a second embodiment of the present invention, eight adjacent sub chips on a wafer form one chip. In this case, in the same way as in the first embodiment, neighbor detecting circuits D1 to D4 are arranged on all sides of each of sub chips 1 to 8. Supplied to a decoder DEC' of each sub chip are the detection signals S1 to S4 of the neighbor detecting circuits D1 to D4 in the same way as in the first embodiment. Also supplied to the decoder DEC' are a decode signal SST1' from the decoder DEC' of the lower side sub chip and a decode signal SST2' from the decoder DEC' of the upper side sub chip. That is, in this case, the decoder DEC' is constructed as illustrated in FIG. 15. Note that, in FIG. 15, SSi (i=1 to 8) corresponds to the sub chip i (i=1 to 8) of FIG. 14.

Note that, in the above-mentioned embodiments, although four or eight adjacent sub chips are used as one chip, other numbers of sub chips can be used as one chip. Also, in this case, the arrangement of four adjacent neighbor detecting circuits within each sub chip is the same, but the construction of decoders becomes different.

Also, the present invention can be applied to a static RAM device or other semiconductor devices in addition to the DRAM device.

As explained hereinbefore, according to the present invention, since adjacent sub chips are used as one chip, an alignment margin of each sub chip is unnecessary, thus improving the integration. Also, since a pad for discriminating a function of each sub chip is unnecessary, an arbitrary number of sub chips can be used as one chip, thus improving the integration.

I claim:

1. A semiconductor device comprising:

a plurality of sub chips adjacent to each other on a wafer, each of said sub chips being able to carry out a same operation, each of said sub chips comprising four neighbor detecting circuits arranged on four sides thereof, each circuit provided for detecting presence or absence of sub chips adjacent to each sub chip.

2. A device as set forth in claim 1, wherein each of said sub chips further comprises a decoder, connected to said four neighbor detecting circuits within each of said sub chips, for decoding neighbor detection signals of said four neighbor detecting circuits to recognize a position of each of said sub chips in a chip assembled by including each of said sub chips.

3. A device as set forth in claim 2, wherein said decoders of two adjacent ones of said sub chips are connected directly to each other.

4. A device as set forth in claim 1, wherein each of said neighbor detecting circuits comprises:

first and second connection lines leading to an edge of one side of each of said sub chips;

a power supply line;

a transfer gate connected between said first connection line and said power supply line, said transfer gate being controlled by a control signal;

a comparator, connected to said second connection line, for comparing a voltage at said second connection line with a reference voltage; and a latch circuit, connected to said comparator, for holding an output signal of said comparator to generate a neighbor detecting signal, said first connection line of one of two adjacent ones of said sub chips being connected to said second connection line of another of the two adjacent ones of said chips.

5. A device as set forth in claim 4, wherein said latch circuit is controlled by a power-on detection signal.

6. A device as set forth in claim 4, wherein each of said sub chips further comprises a failure detecting circuit, connected to said latch circuit and said comparator, for detecting a failure in operation of said comparator.

7. A device as set forth in claim 6, wherein each of said sub chips further comprises a resistor connected between an input of said comparator and another power supply line.

8. A device as set forth in claim 1, wherein each of said neighbor detecting circuits comprises:

first, second, third and fourth connection lines leading to an edge of one side of each of said sub chips;

a power supply line;

a transfer gate connected between said first connection line and said power supply line, said transfer gate being controlled by a control signal;

a comparator, connected to said third connection line, for comparing a voltage at said third connection line with a reference voltage; and a latch circuit, connected to said comparator, for holding an output signal of said comparator to generate a neighbor detecting signal, the neighbor detecting signal being supplied to said fourth connection line, said first and second connection lines of one of two adjacent ones of said sub chips being connected to said third and fourth connection lines, respectively, of the other of the two adjacent ones of said sub chips.

9. A device as set forth in claim 8, wherein said latch circuit is controlled by a power-on detection signal.

10. A device as set forth in claim 8, wherein each of said sub chips further comprises a failure detecting circuit, connected to said latch circuit and said comparator, for detecting a failure in operation of said comparator.

11. A device as set forth in claim 10, wherein each of said sub chips further comprises a resistor connected between an input of said comparator and another power supply line.

12. A device as set forth in claim 8, further comprising a high impedance circuit, connected between said latch circuit and said fourth connection line, said high impedance circuit being controlled by a power-on detection signal.

13. A device as set forth in claim 1, wherein each of said sub chips comprises an input/output switching circuit, connected to at least one of said neighbor detecting circuits, for changing a sequence of input/output signals in accordance with the neighbor detection signal thereof.

14. A device as set forth in claim 2, wherein each of said subchips comprises an input/output switching circuit, connected to said decoder, for changing a sequence of input/output signals in accordance with the decoding signal thereof.

15. A device as set forth in claim 1, wherein a plurality of said sub chips are connected by lead frames.

16. A semiconductor device comprising:

a plurality of sub chips adjacent to each other on a wafer, each of said sub chips being able to carry out a same operation, each of said sub chips comprising four neighbor detecting circuits arranged on four sides thereof, each circuit for detecting presence or absence of sub chips adjacent to each sub chip, each of said neighbor detecting circuits comprising:

first and second connection lines leading to an edge of one side of each of said sub chips;

a power supply line;

a transfer gate connected between said first connection line and said power supply line, said transfer gate being controlled by a control signal;

a comparator, connected to said second connection line, for comparing a voltage at said second connection line with a reference voltage; and a latch circuit, connected to said comparator, for holding an output signal of said comparator to generate a neighbor detecting signal, said latch circuit being operated when a power-on detection signal is turned OFF, said first connection line of one of two adjacent ones of said sub chips being connected to said second connection line of another of the two adjacent ones of said sub chips.

17. A device as set forth in claim 16, wherein each of said sub chips further comprises a failure detecting circuit, connected to said latch circuit and said comparator, for detecting a failure operation of said comparator when the power-on detection signal is turned OFF.

18. A device as set forth in claim 17, wherein each of said sub chips further comprises a resistor connected between an input of said comparator and another power supply line.

* * * * *